(12) United States Patent
Moriya et al.

(10) Patent No.: US 7,556,991 B2
(45) Date of Patent: Jul. 7, 2009

(54) METHOD FOR MANUFACTURING THIN FILM TRANSISTOR, ELECTRO-OPTICAL DEVICE, AND ELECTRONIC APPARATUS

(75) Inventors: Katsuyuki Moriya, Azumino (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 199 days.

(21) Appl. No.: 11/381,852

(22) Filed: May 5, 2006

(65) Prior Publication Data
US 2006/0258068 A1    Nov. 16, 2006

(30) Foreign Application Priority Data
May 13, 2005 (JP) ............... 2005-140736

(51) Int. Cl.
*H01L 21/00* (2006.01)
(52) U.S. Cl. ............... 438/158; 257/E21.414
(58) Field of Classification Search ........... 438/158; 257/E21.414
See application file for complete search history.

(56) References Cited

U.S. PATENT DOCUMENTS

2006/0035064 A1    2/2006   Hirai
2006/0086978 A1*   4/2006   Kobayashi ............. 257/347
2008/0132009 A1    6/2008   Hirai

FOREIGN PATENT DOCUMENTS

| CN | 1550334 | 12/2004 |
|---|---|---|
| JP | 2003-317945 | 11/2003 |
| JP | 2004-349640 | 12/2004 |
| JP | 2005-013985 | 1/2005 |

\* cited by examiner

*Primary Examiner*—Charles D. Garber
*Assistant Examiner*—Stanetta D Isaac
(74) *Attorney, Agent, or Firm*—Harness, Dickey & Pierce, P.L.C.

(57) ABSTRACT

A method for manufacturing a thin film transistor which includes forming precursors of a first and second bank corresponding to a region to form gate, source, and drain electrodes on the substrate with one of a polysilazane liquid, a polysilane liquid, and a polysiloxane liquid by using a droplet discharge method; firing the precursor of the first and second banks to form the first and banks an inorganic layer having polysiloxane as a skeleton; providing a functional liquid to a region partitioned by the first bank to form the gate electrode; forming a semiconductor layer immediately above the gate electrode in a region partitioned by the second bank with an insulation film between; and providing a functional liquid to a region partitioned by the second bank to form the source electrode and the drain electrode, which are coupled to the semiconductor layer.

3 Claims, 10 Drawing Sheets

METHOD FOR MANUFACTURING THIN FILM TRANSISTOR, ELECTRO-OPTICAL DEVICE, AND ELECTRONIC APPARATUS

BACKGROUND

1. Technical Field

The present invention relates to a method for manufacturing a thin film transistor, an electro-optical device, and an electronic apparatus.

2. Related Art

Conventionally, a photolithographic method is used in processes for forming electrodes or wiring patterns when thin film transistors (TFTs), which serve as switching elements used in electro-optical devices such as liquid crystal devices, are manufactured. In the photolithographic method, electrodes or wiring patterns of functional thin film are fabricated by the following processes: a process in which a thin film is overall deposited by a forming method such as spattering, plating, or CVD in advance; a process in which a resist (photosensitive material) is coated on the thin film; a process in which the resist is exposed and developed; and a process in which a conductive film is etched corresponding to the resulting resist pattern. The forming and pattering the functional thin film by using the photolithographic method has the following disadvantages: large-scale equipment such as vacuum devices and sophisticated processes are required in film forming processes and etching processes; an efficiency in the use of material is nearly a few percent; almost all of materials have no choice but to be disposed; and not only high manufacturing cost but also low productivity.

Alternatively, a method is proposed in which conductive patterns such as electrode patterns or wiring patterns are formed on a substrate by using a droplet discharge method (called an inkjet method) in which a liquid material is discharged from a liquid discharge head as a droplet. For example, a method is disclosed in a first example of related art. In the method, ink for a thin film pattern is directly coated on a substrate as a pattern. The ink is a liquid material in which a conductive fine particle such as a metal fine particle or a precursor of the conductive fine particle is dispersed. Then, a heat treatment or a laser irradiation is conducted so that the ink is converted into a conductive thin film pattern. The method has the following advantages: conventional sophisticated film forming processes, photolithography, and etching are not required; processes are drastically simplified; less usage quantity of raw materials; and productivity is increased. JP-A-2003-317945 is the first example of related art.

In the conductive pattern forming method, a bank is formed corresponding to a pattern to be formed. Then, ink is discharged into a region partitioned by the bank, being dried and fired so as to achieve a conductive pattern.

However, for example, when the method is applied to manufacture thin film transistors (TFTs), a bank is required to be formed in every layer so as to fabricate electrodes or wiring patterns by using the formed bank, since a multilayer structure is formed on a substrate to manufacture a TFT. As a result, processes are complicated and productivity is lowered.

SUMMARY

An advantage of the invention is to provide a method, in which productivity is increased by simplifying manufacturing processes, when a thin film transistor is manufactured by using a pattern forming method, which is a droplet discharge method using a bank, and to provide an electro-optical device equipped with the resulting thin film transistor, and further to provide an electronic apparatus equipped with the resulting thin film transistor.

In a method according to a first aspect of the invention for manufacturing a thin film transistor in which a gate electrode, a semiconductor layer, and a source electrode and a drain electrode both of which are coupled to the semiconductor layer, are fabricated on a substrate, the method includes: forming a precursor of a first bank corresponding to a region to form the gate electrode on the substrate with one of a polysilazane liquid, a polysilane liquid, and a polysiloxane liquid; forming a precursor of a second bank corresponding to a region to form the source electrode and the drain electrode on a predetermined position of the precursor of the first bank with one of a polysilazane liquid, a polysilane liquid, and a polysiloxane liquid by using a droplet discharge method; firing the precursor of the first bank and the precursor of the second bank together so as to together form the first bank and the second bank both of which are made of an inorganic layer having polysiloxane as a skeleton; providing a functional liquid containing a conductive material to a region partitioned by one of the precursor of the first bank and the first bank formed from the precursor by using a droplet discharge method so as to form the gate electrode; forming a semiconductor layer on a part located immediately above the gate electrode in a region partitioned by the second bank with an insulation film between the semiconductor layer and the part; and providing a functional liquid containing a conductive material to a region partitioned by the second bank by using a droplet discharge method so as to form the source electrode and the drain electrode both of which are coupled to the semiconductor layer.

According to the method for manufacturing a thin film transistor, the precursor of the first bank is formed with one of a polysilazane liquid, a polysilane liquid, and a polysiloxane liquid, and then the precursor of the second bank is formed on the precursor of the first bank with one of a polysilazane liquid, a polysilane liquid, and a polysiloxane liquid. Subsequently, the precursor of the first bank and the precursor of the second bank are fired together so as to together form the first bank and the second bank. As a result, the manufacturing processes are simplified, and productivity is improved.

In a method according to a second aspect of the invention for manufacturing a thin film transistor in which a gate electrode, a semiconductor layer, and a source electrode and a drain electrode both of which are coupled to the semiconductor layer, are fabricated on a substrate, the method includes: forming a precursor of a first bank corresponding to a region to form the gate electrode on the substrate with one of a polysilazane liquid, a polysilane liquid, and a polysiloxane liquid; providing a functional liquid containing a conductive material to a region partitioned by the precursor of the first bank by using a droplet discharge method so as to form one of the gate electrode and a precursor of the gate electrode; providing one of a polysilazane liquid, a polysilane liquid, and a polysiloxane liquid by a droplet discharge method on the provided functional liquid so as to form a precursor of a cap layer; providing one of a polysilazane liquid, a polysilane liquid, and a polysiloxane liquid by a droplet discharge method to a predetermined position on the precursor of the first bank so as to form a precursor of a second bank corresponding to a region to form the source electrode and the drain electrode; firing the precursor of the first bank, the precursor of the second bank and the precursor of the cap layer together so as to together form the first bank, the second bank and the cap layer those of which are made of an inorganic layer having polysiloxane as a skeleton; forming a semiconductor layer on the cap layer in a region partitioned by the second bank with an insulation film between the semiconductor layer and the cap layer; and providing a functional liquid containing a conductive material to a region partitioned by the second bank by using a droplet discharge method so as to form the source electrode and the drain electrode both of which are coupled to the semiconductor layer.

According to the method for manufacturing a thin film transistor, the precursor of the first bank is formed with one of a polysilazane liquid, a polysilane liquid, and a polysiloxane liquid, and then the precursor of the second bank is formed on the precursor of the first bank with one of a polysilazane liquid, a polysilane liquid, and a polysiloxane liquid, and the precursor of the cap layer is formed with one of a polysilazane liquid, a polysilane liquid, and a polysiloxane liquid. Subsequently, the precursor of the first bank, the precursor of the second bank, and the precursor of the cap layer are fired together so as to together form the first bank, the second bank, and the cap layer. As a result, the manufacturing processes are simplified, and productivity is improved.

In a case where the precursor of the gate electrode is formed by providing a functional liquid to a region partitioned by the precursor of the first bank, the precursor of the cap layer can be fired together with the precursor of the first bank and the precursor of the second bank when the precursors of the respective banks are fired. As a result, the manufacturing processes are more simplified, and productivity is improved.

In addition, the cap layer covering the gate electrode made of the functional liquid is formed as an inorganic layer including polysiloxane as a skeleton. The gate electrode has sufficient density since the inorganic layer has a skeleton structure. As a result, conductive components such as metal in the gate electrode can effectively be prevented from being diffused. As a result, characteristics of a thin film transistor can be prevented from being lowered and the characteristics are stabilized.

In addition, since the cap layer made of the inorganic layer has sufficient density, it has sufficient flatness as compared with the gate electrode formed by a droplet discharge method. Accordingly, the boundary face between the cap layer and the gate insulation film formed on the cap layer is made sufficiently flat. As a result, stability of transistor characteristics can be improved.

Further, productivity can be improved by simplifying processes since the precursor of the cap layer and the precursor of the second bank are formed by the droplet discharge method in the same process.

In the method for manufacturing a thin film transistor, a photosensitive material that contains one of a photo acid generating agent and a photo base generating agent, and functions as a positive type resist is used as the polysilazane liquid, the polysilane liquid, and the polysiloxane liquid.

Accordingly, since one of the polysilazane liquid, the polysilane liquid, and the polysiloxane liquid functions as a positive type resist, the pattern accuracy of the bank formed by one of the liquids can be more increased. Further, the resulting bank can easily be changed to an inorganic layer including polysiloxane as a skeleton by performing a humidification process, or the like.

An electro-optical device according to a third aspect of the invention is equipped with the thin film transistor achieved by the above-mentioned manufacturing methods.

According to the electro-optical device, since the thin film transistor is the one in which manufacturing processes are simplified and productivity is improved, the electro-optical device is also favorable in terms of improved productivity.

An electronic apparatus according to a fourth aspect of the invention is equipped with the electro-optical device.

According to the electronic apparatus, since electro-optical device is favorable in terms of improved productivity, the electronic apparatus is also favorable.

BRIEF DESCRIPTION OF THE DRAWINGS

The invention will be described with reference to the accompanying drawings, wherein like numbers refer to like elements, and wherein.

DESCRIPTION OF EXEMPLARY EMBODIMENTS

Figure 1:
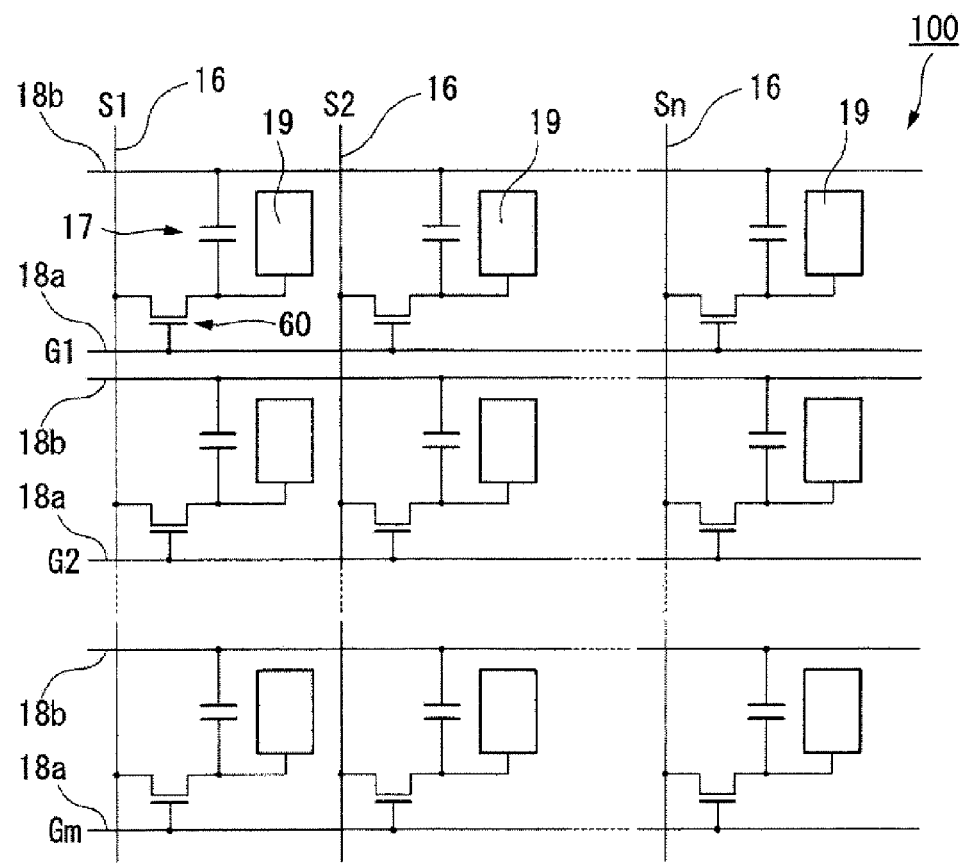
FIG. 1 is an equivalent circuit diagram of a liquid crystal display device according to one embodiment.

The invention will be minutely described hereinafter with reference to the accompanying drawings. In the accompanying drawings, the scale of each layer and each member may be adequately changed so that they are recognizable in the drawings.

Electro-Optical Device

First, one embodiment of an electro-optical device of the invention will be described. FIG. 1 is an equivalent circuit diagram illustrating a liquid crystal display device 100, which is the one embodiment of the electro-optical device of the invention. In the liquid crystal display device 100, a pixel electrode 19 and a TFT 60, which serves as a switching element to control the pixel electrode 19, are formed in each of a plurality of dots that are included in an image display region and are disposed in a matrix. A data line (electrode wiring) 16, to which an image signal is supplied, is electrically connected to a source of the TFT 60. The image signals S1, S2, ..., Sn, are supplied in line-sequentially in this order, or are supplied to every group of the data lines 16, and the group is adjacent to each other and composed of one or more of data lines 16. In addition, a scan line (electrode wiring) 18a is electrically connected to a gate of the TFT 60. The scan signals G1, G2, ..., Gm, are pulsatively and line-sequentially applied to a plurality of scan lines 18a at predetermined timing. Furthermore, the pixel electrode 19 is electrically connected to a drain of the TFT 60. Each of image signals S1, S2, . . . , Sn, which is supplied from the data line 16, is written at predetermined timing by turning on the TFT 60, which is the switching element, only for a predetermined period.

The image signals S1, S2, . . . , Sn, which are written into a liquid crystal at a predetermined level through the pixel electrodes 19, are kept between a common electrode described later and the pixel electrodes 19 for a fixed period. Any gray-scale can be displayed by modulating light by utilizing changes in the orientation and order of a molecular association of the liquid crystal depending on the applied voltage level. In each dot, a storage capacitor 17 is provided in parallel with a liquid crystal capacitance formed between the pixel electrode 19 and the common electrode in order to prevent the image signal written in the liquid crystal from a leak. A capacitance line 18b is electrically connected to an electrode positioned at a minus side of the storage capacitor 70.

Figure 2:
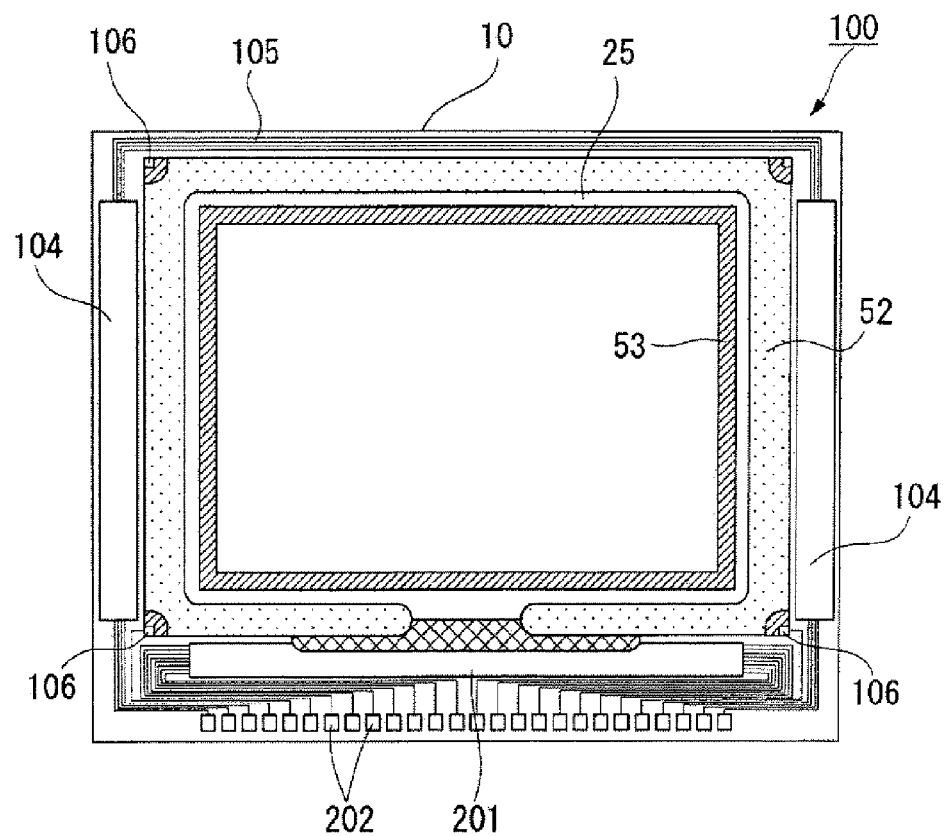
FIG. 2 is a plan view illustrating a whole structure of a liquid crystal display device according to the embodiment

Next, FIG. 2 shows a whole structure of the electro-optical display device 100. The liquid crystal display device 100 is structured so that a TFT array substrate 10 and a counter substrate 25 are bonded together with a sealing member 52 having a roughly rectangular frame shape in a plane view. A liquid crystal sandwiched between the substrates 10 and 25 is sealed with the sealing member 52. Note that in FIG. 2, the periphery edge of the counter substrate 25 and the periphery edge of the sealing member 52 are displayed so as to coincide with each other in a plane view.

A light shielding film (peripheral parting) 53 made of a light shielding material is formed in a rectangular frame shape inside a region of the sealing member 52. In a peripheral circuit region outside the sealing member 52, a data line drive circuit 201 and a mounting terminal 202 are formed along one side of the TFT array substrate 10. A scan line drive circuit 104 is formed along each of two sides adjacent to the one side. A plurality of wiring patterns 105, which connects between the scan line drive circuits 104, is formed on the remaining side of the TFT array substrate 10. Each of a plurality of inter-substrate conducting members 106, which provides electrical conduction between the TFT array substrate 10 and the counter substrate 25, is provided at the corner of the counter substrate 25.

Figure 3:
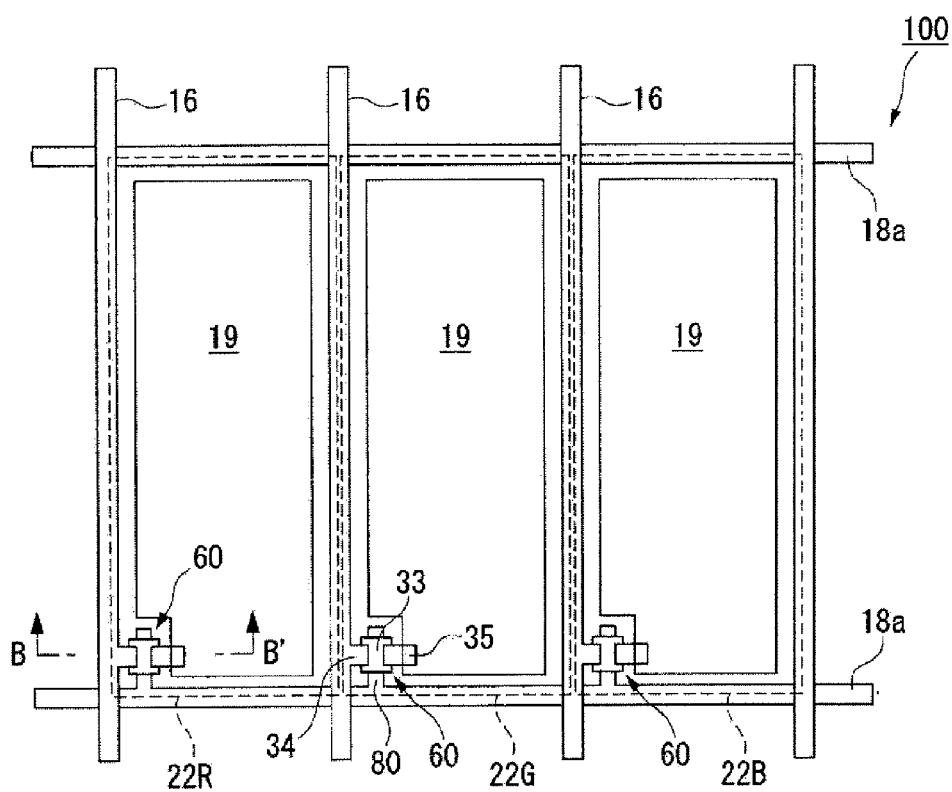
FIG. 3 is a plan structural view illustrating a pixel region of the liquid crystal display device according to the embodiment.

Next, FIG. 3 is an explanatory view of a pixel structure of the liquid crystal display device 100, and schematically illustrates a plan structure. As shown in FIG. 3, in the display region of the liquid crystal display device 100, a plurality of scan lines 18a is extended in one direction, while a plurality of data lines 16 is extended in a direction intersected with the scan lines 18a. In FIG. 3, a dot region is a region having a roughly rectangular frame shape in a plane view, which is surrounded by the scan lines 18a and the data lines 16. A color filter for one color of three primary colors is formed corresponding to one dot region. The shown three dot regions in the figure form one pixel region including coloring parts 22R, 22G, and 22B for three colors. The coloring parts 22R, 22G, and 22B are periodically arranged in the display region of the liquid crystal display device 100.

In each dot region shown in FIG. 3, the pixel electrode 19 is provided which made of a translucent conductive film such as indium tin oxide (ITO) and has a roughly rectangular frame shape in a plane view. In the region, the TFT 60 is disposed so as to connect it to the pixel electrode 19, the scan line 18a, and the data line 16. The TFT 60 includes a semiconductor layer 33, a gate electrode 80, a source electrode 34 and a drain electrode 35. The gate electrode 80 is disposed at the lower layer side (a side adjacent to a substrate) of the semiconductor layer 33, while the source electrode 34 and the drain electrode 35 are disposed at the upper layer side of the semiconductor layer 33. The channel region of the TFT 60 is formed in a region, to which the gate electrode 80 faces, of the semiconductor layer 33, while the source region and the drain region are respectively formed at both sides of the channel region in the semiconductor layer.

The gate electrode 80 is formed by brunching part of the scan line 18a and extending it in the direction where the data line 16 extends. At its fore-end, the gate electrode 80 faces the semiconductor layer 33 in the direction perpendicular to FIG. 3 with an insulation film (gate insulation film), which is not shown, between the gate electrode 80 and the semiconductor layer 33. The source electrode 34 is formed by brunching part of the data line 16 and extending it in the direction where the scan line 18a extends so that it is electrically connected to the semiconductor layer 33 (source region). One end (the left end shown in the figure) of the drain electrode 35 is electrically connected to the semiconductor layer 33 (drain region), while the other end (the right end shown in the figure) of the drain electrode 35 is electrically connected to the pixel electrode 19.

Under the above-described structure, the TFT 60 functions as a switching element, which writes an image signal supplied through the data line 16 into a liquid crystal at predetermined timing when the TFT 60 is turned on by a gate signal input through the scan line 18a for a fixed period.

Figure 4:
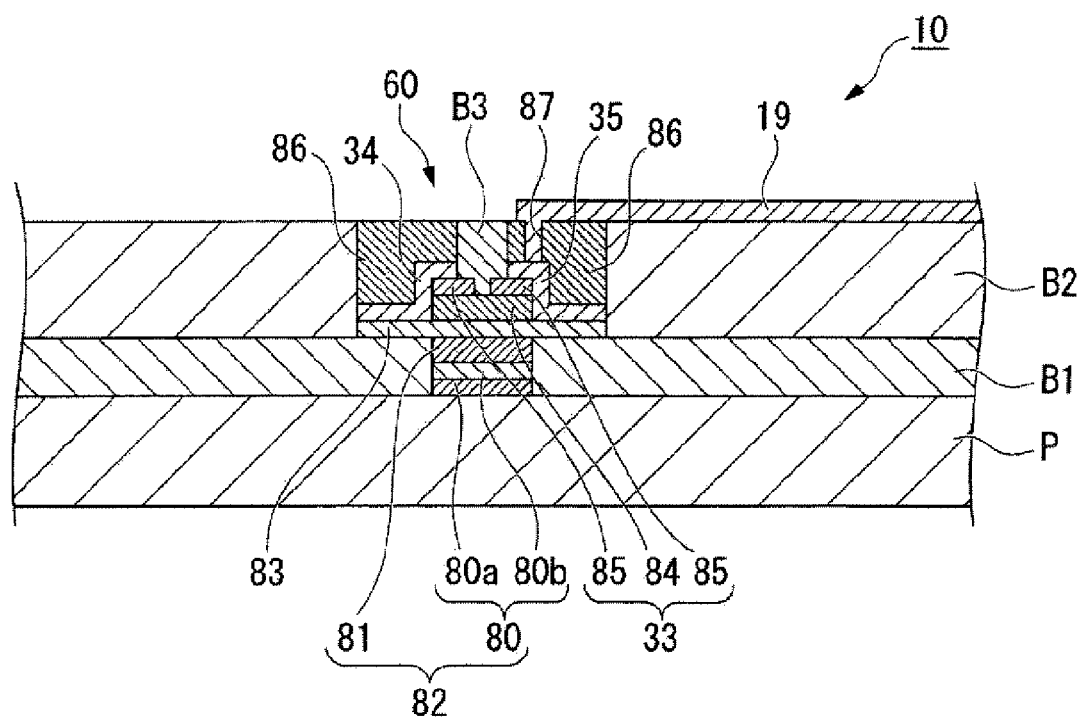
FIG. 4 is a partial cross-sectional view of a TFT array substrate according to the embodiment.

FIG. 4 is an essential cross-sectional view of the TFT array substrate 10 taken along the line B-B' in FIG. 3. As shown in FIG. 4, the TFT array substrate 10 is structured by forming the TFT 60 according to the invention at the inner side (upper side shown in the figure) of the glass substrate P, and further by forming the pixel electrode 19. On the glass substrate P, a first bank B1 a part of which is opened is formed. The first bank B1 is made of a polysilazane liquid as described later. In the opening, the gate electrode 80 and a cap layer 81 covering the electrode 80 are embedded. The gate electrode 80 is composed of a first electrode layer (base layer) 80a and a second electrode layer (covering layer) 80b as a multilayer structure. The first electrode layer 80a is made of metal such as Ag, Cu, and Al, while the second electrode layer 80b is made of metal such as Ni, Ti, W, and Mn. The cap layer 81 is made of any of a polysilazane liquid, a polysilane liquid, and a polysiloxane liquid, and composed of an inorganic layer having polysiloxane as a skeleton.

A second bank B2 is formed on the first bank B1. In the second bank B2, an opening is formed to expose a region including the gate electrode 80 and the cap layer 81. In the opening, a gate insulation film 83 made of silicon oxide, silicon nitride, or the like is deposited. The semiconductor layer 33 is deposited at a position on the gate insulation film 83. The position coincides with the gate electrode 80 in a plane view. The semiconductor layer 33 is composed of an amorphous silicon layer 84 and an $N^+$ silicon layer 85 deposited on the amorphous silicon layer 84. The $N^+$ silicon layer 85 is divided into two parts, which are apart from each other in a plane view on the amorphous silicon layer 84. The $N^+$ silicon layer 85 at one side is electrically connected to the source electrode 34, which is deposited over the gate insulation film 83 and the $N^+$ silicon layer 85, while the $N^+$ silicon layer 85 at the other side is electrically connected to the drain electrode 35, which is deposited over the gate insulation film 83 and the $N^+$ silicon layer 85.

The source electrode 34 and the drain electrode 35 are divided by a third bank B3, which is formed in the opening of the second bank B2. The electrodes 34 and 35 are formed by a droplet discharge method as described later in a region partitioned by the second bank B2 and the third bank B3. In addition, an insulation material 86 is disposed on the source electrode 34 and the drain electrode 35 so that the opening is filled with the material 86. A contact hole 87 is formed in the insulation material 86, through which the pixel electrode 19 formed on the second bank B2 and the insulation material 86 is electrically connected to the drain electrode 35. The TFT 60 of the invention is structured as described above As shown in FIG. 3, the data line 16 and the source electrode 34 are integrally formed as well as the scan line 18a and the gate electrode 80. Accordingly, the data line 16 is covered with the insulation material 86 in the same manner as that of the source electrode 34, while the scan line 18a is covered with the cap layer 81 in the same manner as that of the gate electrode 80.

Practically, an alignment layer is formed on the surfaces of the pixel electrode 19, the second bank B2, and the third bank B3, and the insulation material 86 to control an initial alignment condition of a liquid crystal. On the outer face side of the glass substrate P, a retardation film or a polarizer is disposed to control a polarized condition of light entered in a liquid crystal layer. In addition, on the outside (panel back face side) of the TFT array substrate 10, a backlight is disposed, which is used as lighting means for a transmissive or semi-transmissive reflective type liquid crystal display device.

The counter substrate 25, while a detailed figure is omitted, is structured by layering a color filter layer and a counter electrode. The color filter layer, in which the coloring parts 22R, 22G, and 22B shown in FIG. 3 are arranged, is formed at the inner face side (surface facing the TFT array substrate) of a substrate in a manner similar to the glass substrate P. The counter electrode is formed over the substrate 25 and made of a translucent conductive film. In addition, on the counter electrode, an alignment film is formed in the same manner as that of the TFT array substrate. On the out face side of the substrate, a retardation film or a polarizer is disposed if necessary.

A liquid crystal layer sealed between the TFT array substrate 10 and the counter substrate 25 mainly contains liquid crystal molecules. As the liquid crystal molecule contained in the liquid crystal layer, any liquid crystal molecules such as nematic liquid crystal, smectic liquid crystal can be used as long as they can be aligned. However, as TN type liquid crystal panels, it is preferable that one forms nematic liquid crystal. Phenylcyclohexane-derivative liquid crystal, biphenyl-derivative liquid crystal, biphenylcyclohexane-derivative liquid crystal, terphenyl-derivative liquid crystal, phenylether-derivative liquid crystal, phenylester-derivative liquid crystal, bicyclohexane-derivative liquid crystal, azomethine-derivative liquid crystal, azoxy-derivative liquid crystal, pyrimidine-derivative liquid crystal, dioxane-derivative liquid crystal, and cubane-derivative liquid crystal are exemplified.

The liquid crystal display device 100, which is structured as described above, of the embodiment can display any gray scales by modulating light entered from a backlight in a liquid crystal layer in which an alignment condition is controlled by a voltage applied. In addition, any color can be displayed by mixing color light of three primary colors (R, G, and B) in each pixel since the coloring parts 22R, 22G, and 22B are provided in each dot.

Manufacturing Method of a Thin Film Transistor.

Next, a method manufacturing a thin film transistor according to another embodiment of the invention will be described based on a manufacturing method of the TFT 60. In the TFT 60, a pattern formation is carried out by a droplet discharge method so as to form the gate electrode 80, source electrode 34, and drain electrode 35. Specifically, the droplet discharge method is also applied to form the cap layer 81 and the second bank B2.

Droplet Discharge Device

First, a droplet discharge device used in the manufacturing method of the embodiment will be described. In the manufacturing method, ink (a functional liquid) containing a conductive fine particle or other functional materials is discharged as a droplet from a nozzle of a droplet discharge head included in a droplet discharge device so as to form each structural element included in a thin film transistor. As the droplet discharge device used in the embodiment, the one structured as shown in FIG. 5 can be employed.

Figure 5A:
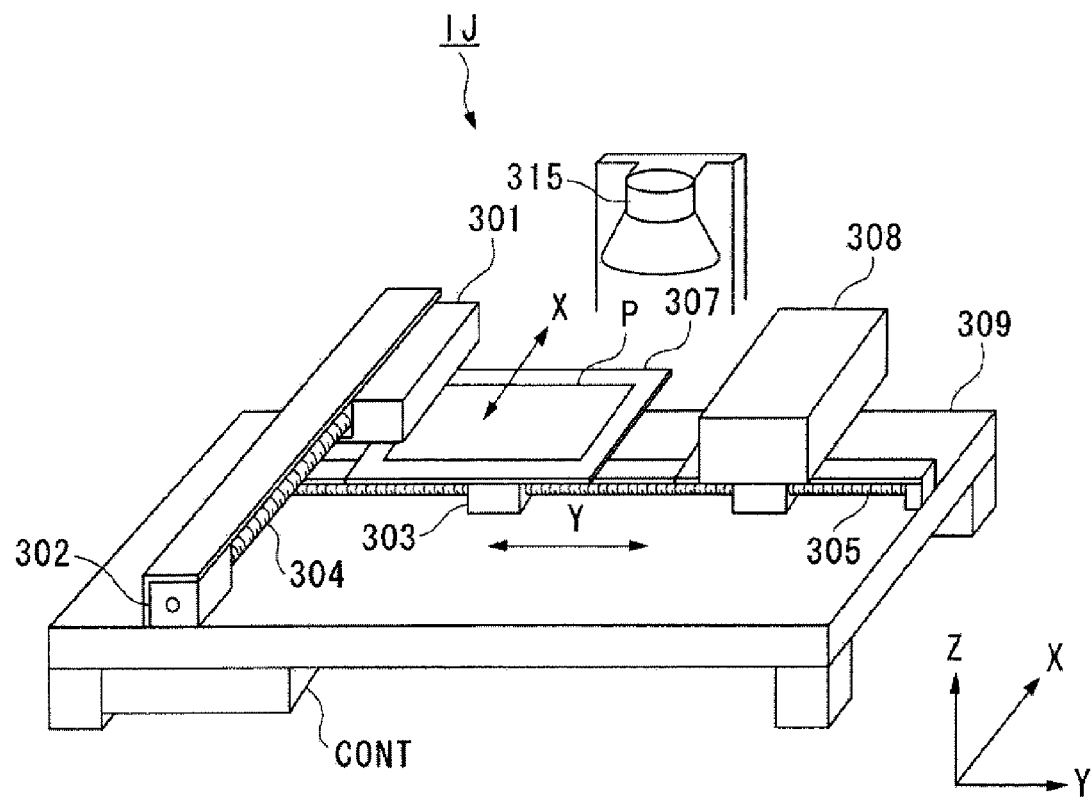
FIG. 5A is a schematic view illustrating an example of a droplet discharge device.

FIG. 5A is a perspective view illustrating a schematic structure of a droplet discharge device IJ used in the embodiment. The droplet discharge device IJ includes a droplet discharge head 301, an X-axis direction drive axis 304, a Y-axis direction guide axis 305, a controller CONT, a stage 307, a cleaning mechanism 308, a base 309, and a heater 315.

The stage 307, which supports the substrate P to which ink (a functional liquid) is provided by the droplet discharge device IJ, includes a fixing mechanism (not shown) for fixing the substrate P to a reference position.

The droplet discharge head 301 is a multi-nozzle type droplet discharge head equipped with a plurality of discharge nozzles. The longitudinal direction of the head 301 coincides with the Y-axis direction. The plurality of discharge nozzles is disposed on the lower surface of the droplet discharge head 301 in the Y-axis direction with a constant interval. The ink (functional liquid) is discharged from the discharge nozzles of the droplet discharge head 301 to the substrate P supported by the stage 307.

An X-axis direction drive motor 302 is connected to the X-axis direction drive axis 304. The X-axis direction drive motor 302, which is a stepping motor or the like, rotates the X-axis direction drive axis 304 when a driving signal for the X-axis direction is supplied from the controller CONT. The X-axis direction drive axis 304 rotates so as to move the droplet discharge head 301 in the X-axis direction.

The Y-axis direction guide axis 305 is fixed so as not to move with respect to the base 309. The stage 307 is equipped with a Y-axis direction drive motor 303. The Y-axis direction drive motor 303, which is a stepping motor or the like, moves the stage 307 in the Y-axis direction when a driving signal for the Y-axis direction is supplied from the controller CONT.

The controller CONT supplies a voltage to the droplet discharge head 301 for controlling a droplet discharge. The controller CONT also supplies a drive pulse signal to the X-axis direction drive motor 302 for controlling the droplet discharge head 301 in an X-axis direction movement, and a drive pulse signal to the Y-axis direction drive motor 303 for controlling the stage 307 in a Y-axis direction movement.

The cleaning mechanism 308 cleans the droplet discharge head 301. The cleaning mechanism 308 is equipped with a drive motor (not shown) for the Y-axis direction. Driving the Y-axis direction drive motor moves the cleaning mechanism along the Y-axis direction guide axis 305. The movement of the cleaning mechanism 308 is also controlled by the controller CONT.

The heater 315, which is means to subject the substrate P under heat treatment by lump annealing, evaporates and dries a solvent contained in a liquid material applied on the substrate P. Turning on and off of the heater 315 are also controlled by the controller CONT.

The droplet discharge device IJ discharges a droplet to the substrate P while relatively scanning the droplet discharge head 301 and the stage 307 supporting the substrate P. Hereinafter, the X-axis direction is referred to as a scan direction, while the Y-axis direction perpendicular to the X-axis direction is referred to as a non-scan direction. Therefore, the plurality of discharge nozzles of the droplet discharge head 301 is disposed in the Y-axis direction, which is the non-scan direction, with a constant interval. In FIG. 5A, the droplet discharge head 301 is disposed at a right angle with respect to the traveling direction of the substrate P. However, the droplet discharge head 301 may be disposed so as to intersect with the traveling direction of the substrate P by adjusting its fixing angle. Accordingly, the pitch between the nozzles can be adjusted by adjusting the fixing angle of the droplet discharge head 301. In addition, the distance between the substrate P and the nozzle surface may be arbitrary adjusted.

Figure 5B:
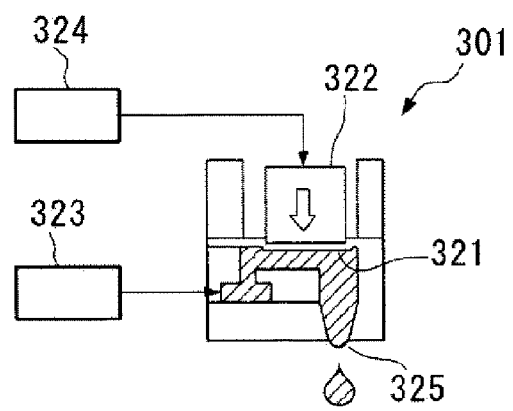
FIG. 5B is a schematic view illustrating a discharge head.

FIG. 5B is a schematic structural view of a droplet discharge head in order to describe a discharge principal of ink by a piezo method.

In FIG. 5B, a piezo element 322 is disposed adjacent to a liquid chamber 321 storing ink (functional liquid). The ink is supplied to the liquid chamber 321 through an ink supply system 323 including a material tank for ink storage. The piezo element 322 is connected to a driving circuit 324, through which a voltage is applied to the piezo element 322 so as to deform the piezo element 322. This deformation of the piezo element 322 elastically deforms the liquid chamber 321. Then, resulting change in a chamber volume during the elastic deformation renders the liquid material to be discharged from the nozzle 325.

In this case, a strain amount of the piezo element 322 can be controlled by changing the value of the applied voltage. In addition, strain velocity of the piezo element 322 can be controlled by changing the frequency of the applied voltage. The droplet discharge by the piezo method has an advantage in that few influences are given to a composition of a material since no heat is applied to the material.

Ink (Functional Liquid)

Here, ink (functional liquid) will be described which is used for forming a conductive pattern so as to form the gate electrode 80, source electrode 34, drain electrode 35, or the like in the manufacturing method of the embodiment.

The ink (functional liquid) for a conductive pattern used in the embodiment is a dispersion liquid in which a conductive fine particle is dispersed into a dispersion medium, or one composed of its precursor. As the conductive fine particle, for example, a metal fine particle containing gold, silver, cupper, palladium, niobium, nickel and the like, their precursors, their alloys, their oxides, and a fine particle of a conductive polymer, indium-tin oxides or the like are employed. These conductive fine particles may be used by coating organic matter on their surfaces in order to improve dispersion property. The conductive fine particle preferably has a diameter of about 1 nm to 0.1 μm. If the diameter is more than 0.1 μm, which possibly results in not only the nozzle on the droplet discharge head 301 being clogged, but also results in density of the resulting film being deteriorated. In contrast, if less than 1 nm, the volume ratio of the coating material to the conductive fine particle becomes large. As a result, the organic matter occupies excess parts in the resulting film.

Any dispersion medium can be used as long as capable of dispersing the above-described conductive particles and cause no aggregation. For example, other than water, alcohols such as methanol, ethanol, propanol, butanol, or the like, a hydro-carbon compounds such as n-heptane, n-octane, decane, dodecane, tetradecane, toluene, xylene, cymene, durene, indene, dipentene, tetrahydronaphthalene, decahydronaphthalene, cyclohexylbenzene or the like, an ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy-ethane, bis(2-methoxyethyl)ether, p-dioxane, or the like, and a polar compounds such as propylene carbonate, gamma-butyrolactone, N-methyl-2-pyrrolidone, dimethylformamide, dimethyl sulfoxide, cyclohexanone, or the like are exemplified. Water, the alcohols, the carbon hydride series compounds, and the ether series compounds are preferable for the dispersion medium, water and the carbon hydride series compounds are much preferred from the following points of view: dispersibility of the fine particles, stability of the dispersion, and an ease of the application for the droplet discharge method (inkjet method).

It is preferable that surface tension of the dispersion liquid of the conductive fine particle is in the range of 0.02 N/m to 0.07 N/m. If the surface tension is below 0.02 N/m when the liquid is discharged using the inkjet method, the wettability of ink compositions with respect to a nozzle surface is increased, rendering it likely to cause a flight curve, while if the surface tension exceeds 0.07 N/m a meniscus shape at the tip of the nozzle is unstable, rendering the control of the discharge amount and discharge timing problematic. In order to adjust surface tension, it is advisable to add a surface tension regulator of a fluorine based, silicone based, nonionic based, or the like, to the dispersion liquid, in a minute amount within the range in which a contact angle with respect to a substrate is not unduly lowered. The nonionic surface tension regulator enhances the wettability of a liquid with respect to a substrate, improves leveling property of a film, and serves to prevent minute concavities and convexity of film from being made. The surface tension regulators may include an organic compound such as alcohol, ether, ester, and ketone, if necessary.

The viscosity of the dispersion liquid is preferably 1 mPa·s to 50 mPa·s. When a liquid material is discharged by the inkjet method as a droplet, if the viscosity is below 1 mPa·s, the periphery part of a nozzle is easily contaminated due to the leakage of ink, while if the viscosity is greater than 50 mPa·s, which not only results in a nozzle opening being clogged frequently, rendering smooth discharge of the droplet difficult, but also results in the discharge quantity of the droplet being reduced.

As for the ink, specifically, used for forming the cap layer 81 and the second bank B2, a polysilazane liquid is exemplified. The polysilazane liquid is composed substantially of polysilazane as a solid. For example, a photosensitive polysilazane liquid (photosensitive material) is used which contains polysilazane and a photo acid generating agent. The photosensitive polysilazane liquid functions as a positive type resist. This liquid can be directly patterned by exposure and development processes. As the photosensitive polysilazane, photosensitive polysilazane disclosed in JP-A-2002-72504 can be exemplified. As the photo acid generating agent contained in the photosensitive polysilazane, one is also disclosed in JP-A-2002-72504. Note that the photosensitive material such as a photosensitive polysilazane liquid may contain a photo base generating agent instead of the photo acid generating agent.

In addition, the photosensitive polysilazane liquid is also used for a material for forming the first bank B1 as described later.

As for the polysilazane, if the polysilazane is polymethylsilazane expressed by chemical formula (1), it is partially hydrolyzed as expressed by chemical formula (2) or (3) by a humidification process as described later, and further is condensed to polymethylsiloxane $[-(SiCH_3O_{1.5})_n-]$ as expressed in chemical formulas (4) to (6) by a heating process carried out at below 350 degrees centigrade. While chemical formulas are omitted, the following reactions occur: the methyl group at the side chain is eliminated by a heating process at 350 degrees centigrade and above; and specifically in the heating process at from 400 degrees centigrade to 450 degrees centigrade, the methyl group at the side chain is almost eliminated to be polysiloxane. Note that in chemical formulas (2) to (6), only a basic constituting unit (repeating unit) in a chemical compound is expressed by simplifying the chemical formula for describing a reaction mechanism.

The polymethylsiloxane or polysiloxane, which is formed as described above, has sufficient density as compared with a metal layer, which is formed by disposing using a droplet discharge method and firing, since it has polysiloxane, which is inorganic, as a skeleton. Accordingly, the surface of the formed layer (film) has also good flatness. In addition, it is preferable for the bank material since it has high resistance to heat treatment.

$$—(SiCH_3(NH)_{1.5})_n— \quad \text{Chemical formula (1)}$$

$$SiCH_3(NH)_{1.5}+H_2O \rightarrow SiCH_3(NH)(OH)+0.5NH_3 \quad \text{Chemical formula (2)}$$

$$SiCH_3(NH)_{1.5}+2H_2O \rightarrow SiCH_3(NH)_{0.5}(OH)_2+NH_3 \quad \text{Chemical formula (3)}$$

$$SiCH_3(NH)(OH)+SiCH_3(NH)(OH)+H_2O \rightarrow 2SiCH_3O_{1.5}+2NH_3 \quad \text{Chemical formula (4)}$$

$$SiCH_3(NH)(OH)+SiCH_3(NH)_{0.5}(OH)_2 \rightarrow 2SiCH_3O_{1.5}+1.5NH_3 \quad \text{Chemical formula (5)}$$

$$SiCH_3(NH)_{0.5}(OH)_2+SiCH_3(NH)_{0.5}(OH)_2 \rightarrow 2SiCH_3O_{1.5}+NH_3+H_2O \quad \text{Chemical formula (6)}$$

Method for Manufacturing an TFT Array Substrate

Hereinafter, each manufacturing process of the TFT array substrate 10, which includes a method for manufacturing the TFT 60, will be described with reference to FIGS. 6 to 9. FIGS. 6 to 9 are cross-sectional views illustrating series of processes in the manufacturing method of the embodiment.

Gate Electrode Forming Process

As shown in FIGS. 6A to 6C, and 7A to 7D, the gate electro 80 is formed as follows: the glass substrate P made of non-alkali glass is prepared as a base; the first bank B1 is formed on one face side of the substrate P; and given ink (functional liquid) is dropped in an opening 30 fabricated in the first bank B1 so as to form the gate electrode 80 in the opening 30. The gate electrode forming process includes a bank forming process, a lyophobic process, a first electrode layer forming process, a second electrode layer forming process, and a firing process.

Forming Process of a Precursor of the First Bank

Figure 6A:
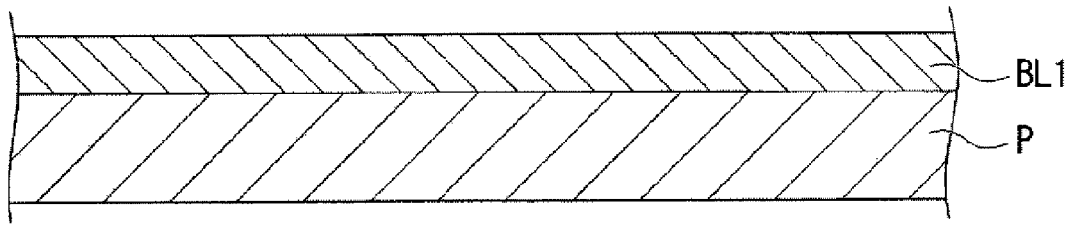
FIG. 6 is a cross-sectional process drawing illustrating a method for manufacturing a thin film transistor according to another embodiment of the invention.

First, the first bank having an opening with a given pattern is formed on the glass substrate P to form the gate electrode 80 (and the scan line 18a) on the glass substrate with the given pattern. The first bank is a partition member to partition the surface of the substrate in a plan view. Photolithography is specifically and preferably used for forming the bank. Specifically, the above-described photosensitive polysilazane liquid is coated as shown in FIG. 6A so as to meet the height of the bank formed on the glass substrate P by spin coat, spray coat, roll coat, die coat, dip coat, or the like, resulting in a polysilazane thin film BL1 being formed.

Next, the resulting polysilazane thin film BL1 is subjected to a pre-baking under a condition, for example, in which at 110 degrees centigrade for about one minute on a hot plate.

Figure 6B:
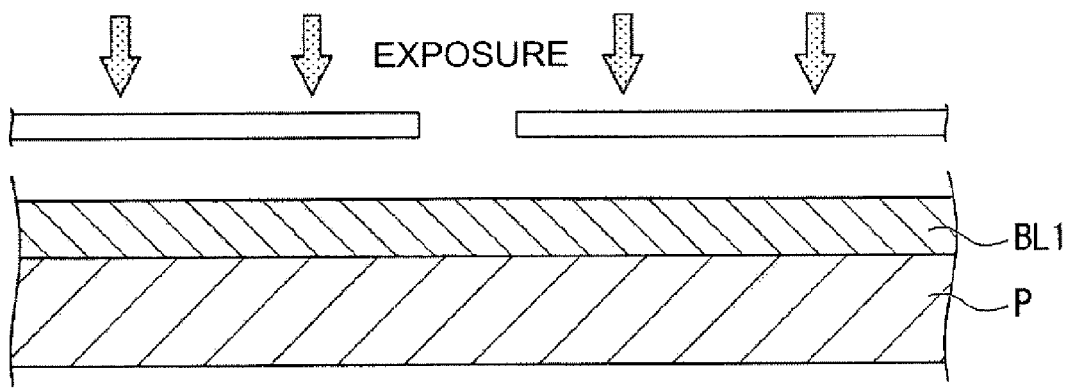

Then, the polysilazane thin film BL1 is exposed with a mask as shown in FIG. 6B. In the exposure, part removed by a development process carried on later is selectively exposed since the polysilazane thin film BL1 functions as a positive type resist as described above. An exposure light source is used by adequately selecting from ones, which are used in a conventional photoresist exposure, such as high pressure mercury lamps, low pressure mercury lamps, metal halide lamps, xenon lamps, excimer lasers, x rays, and electron beams, corresponding to composition or photosensitive characteristics of the photosensitive polysilazane liquid. Energy of irradiated light is typically 0.05 mJ/cm$^2$ and above, preferably 0.1 mJ/cm$^2$ and above, though it depends on a light source and film thickness. While the upper limit is not specifically set, typically it is set to be 10000 mJ/cm$^2$ and below since setting an irradiated amount too large is not practical from the processing time point of view. The exposure is typically carried out in a surrounding atmosphere (in the air) or a nitrogen atmosphere. An atmosphere having a rich oxygen content may be employed to enhance the decomposition of polysilazane.

The photosensitive polysilazane thin film BL1 containing a photo acid generating agent selectively produces an acid in a film exposed in the exposing process so as to cleave Si—N bond of polysilazane. Then, the polysilazane thin film BL1 is partially hydrolyzed as expressed by the chemical formula (2) or (3) by reacting with moisture in a surrounding atmosphere. Finally, silanol (Si—OH) bond is produced, resulting in polysilazane being decomposed.

Figure 6C:
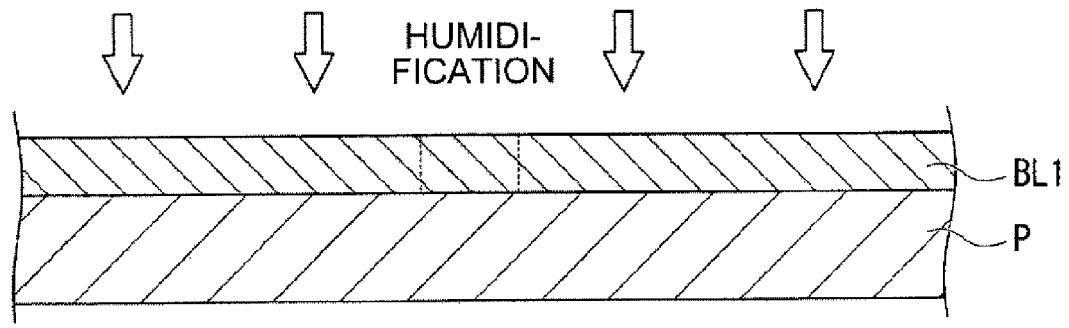

Next, the polysilazane thin film BL1 after disposed is subjected to the humidification process as shown in FIG. 6C, under a condition, for example, in which temperature is at 25 degrees centigrade, relative humidity is 85%, and for about five minutes, in order to further enhance the production of silanol (Si—OH) bond and decomposition of polysilazane. If moisture is continuously supplied into the polysilazane thin film BL1 as described above, an acid contributed to cleave the Si—N bond of polysilazane acts repeatedly as a cleaving catalyst. While the Si—OH bond also occurs in the exposure, the Si—OH bond in polysilazane is further enhanced by the humidification process on exposed film after the exposure.

As for the humidity in a process atmosphere in the humidification process, the higher the humidity, the faster the speed of Si—OH bond can be made. Note that if the humidity is too high, dew condensation possibly occurs on the film surface. From this point of view, the relative humidity is practically is set to be 90% and below. As for the humidification process, gas containing moisture may be contacted to the polysilazane thin film BL1. Accordingly, the exposed substrate P may be placed inside a humidification process device, in to which the gas containing moisture is continuously introduced. Alternatively, the exposed substrate P may be placed inside a humidification process device, in which humidity is adjusted and controlled by introducing the gas containing moisture in advance, for a desired time period.

Figure 7A:
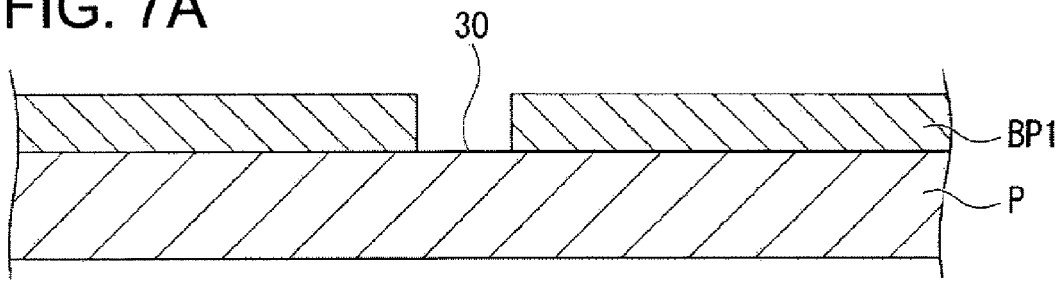
FIG. 7 is a cross-sectional process drawing illustrating the method for manufacturing a thin film transistor of the embodiment.

Then, the polysilazane thin film BL1 after the humidification process is subjected to the development process under a condition, for example, in which temperature is at 25 degrees centigrade, and a liquid of tetra methyl ammonium hydroxide (TMAH) of concentration of 2.38%, and then the exposed part is selectively removed. As a result, the precursor BP1, which has the opening 30 corresponding to a region for forming the gate electrode 80, of the first bank is formed as shown in FIG. 7A. As a developer, other alkali developers than TMAH can be used. Choline, sodium silicate, sodium hydroxide, potassium hydroxide, and like can be exemplified as the developers.

Lyophobic Process

Next, rinsing with pure water is carried out if necessary. Then, the precursor BP1 of the first bank is subjected to the lyophobic process, if necessary, so as to give lyophobicity to the surface of the BP1. As for the lyophohic process, a plasma treatment method (CF$_4$ plasma treatment method) can be employed as an example, which is carried out in the atmospheric air with tetrafluoromethane as a treatment gas. An example of conditions of the CF4 plasma treatment is as follows: plasma power is from 50 kW to 1000 kW; a tetrafluoromethane gas flow volume is from 50 ml/min. to 100 ml/min.; substrate transportation speed with respect to a plasma discharge electrode is from 0.5 mm/sec. to 1020 mm/sec.; and a substrate temperature is from 70 degrees centigrade to 90 degrees centigrade. The treatment gas is not limited to tetrafluoromethane, while other fluorocarbon gases can also be used.

By carrying out such lyophobic process, high lyophobicity is given to the precursor BP1 of the first bank since a fluorine group is introduced into an alkyl group included in the BP1.

In addition, it is preferable that ashing treatment with O2 plasma or ultra violet rays (UV rays) radiation treatment is carried out for the purpose of cleaning the surface of the glass substrate P exposed at the bottom of the opening 30 prior to the lyophobic process. This process brings the following advantages: residue of bank material can be removed from the surface of the glass substrate P, resulting in the difference of a contact angle with respect to the precursor BP1 after the lyophobic process and a contact angle with respect to the substrate surface being large; and as a result, a droplet, which will be provided into the opening 30 in later process, can be precisely trapped in the opening 30.

The O2 ashing treatment is specifically carried out by irradiating the substrate P with oxygen in a plasma from a plasma discharge electrode. An example of conditions is as follows: plasma power is from 50 kW to 1000 kW; an oxygen gas flow volume is from 50 ml/min. to 100 ml/min.; substrate transportation speed of the substrate P with respect to a plasma discharge electrode is from 0.510 mm/sec. to 10 mm/sec.; and a substrate temperature is from 70 degrees centigrade to 90 degrees centigrade.

The lyophobic process ($CF_4$ plasma treatment) on the precursor BP1 of the first bank somewhat affects on the surface of the substrate P on which the lyophobic process has been performed. However, in a case where the substrate P is particularly made of glass or the like, the substrate P practically does not lose its lyophobocity, i.e. wettability, since the fluorine group is hardly introduced to the substrate P by the lyophobic process.

First Electrode Layer Forming Process

Next, ink for forming the first electrode layer (not shown) is dropped to the opening 30 from the droplet discharge head 301 of the droplet discharge device IJ. Here, ink is discharged and provided, which contains silver (Ag) as a conductive fine particle and diethylene glycol diethyl ether as a solvent (dispersion medium). In the process, since the surface of the precursor BP1 of the first bank is provided with lyophobicity, while the surface of the substrate at the bottom of the opening is provided with lyophilicity, when part of a droplet discharged lands on the precursor BP1 of the first bank, the part of the droplet is repelled by the surface to slip into the opening 30.

Next, after discharging the droplet containing the ink for forming an electrode, a drying process is carried out in order to remove the dispersion medium, if necessary. The drying process can be carried out, for example, by using a typical hot plate or electric furnace for heating the substrate P. In the embodiment, the heating is carried out, for example, at 180 degrees centigrade, and for about 60 minutes. The heating may be carried out in a nitrogen gas atmosphere, need not always necessarily to be done in the air.

Figure 7B:
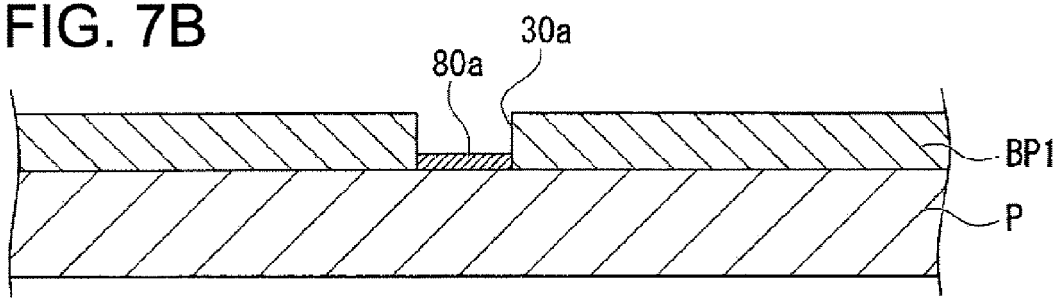

The drying process can also be carried out by lamp annealing. Examples of light sources used for lamp annealing are not particularly limited, and can include infrared lamps, xenon lamps, YAG lasers, argon lasers, carbon dioxide lasers, and excimer lasers such as XeF, XeCL, XeBr, KrCL, ArF, and ArCL. Such light sources are typically used within the range of 10 W to 5000 W, but in the embodiment, within the range of 100 W to 1000 W is adequate. By performing the intermediate drying process, the first electrode layer 80a, which is a solid, is formed as shown in FIG. 7B.

Second Electrode Layer Forming Process

Next, ink for forming the second electrode layer (not shown) is provided to the opening 30 of the precursor BP1 of the first bank by using a droplet discharge method with a droplet discharge device. Here, ink (liquid material) is discharged and provided, which contains nickel (Ni) as a conductive fine particle, and water and diethanolamine as a solvent (dispersion medium). In the process, since the surface of the precursor BP1 of the first bank is provided with lyophobicity, while the surface of the substrate at the bottom of the opening is provided with lyophilicity, when part of a droplet discharged lands on the precursor BP1 of the first bank, the part of the droplet is repelled by the surface to slip into the opening 30. However, the surface of the first electrode layer 80a, which has been formed inside the opening 30, does not always have high lyophilicity with respect to the ink dropped in the process. Thus, an intermediate layer may be formed on the first electrode layer 80a for the purpose of improving ink wettability.

After discharging a droplet, a drying process is carried out in order to remove a dispersion medium, if necessary. The drying process can be carried out, for example, by using a typical hot plate or electric furnace for heating the substrate P. An example of process conditions is as follows: at 180 degrees centigrade, and for about 60 minutes. The heating may also be carried out in a nitrogen gas atmosphere, need not always necessarily to be done in the air.

Figure 7C:
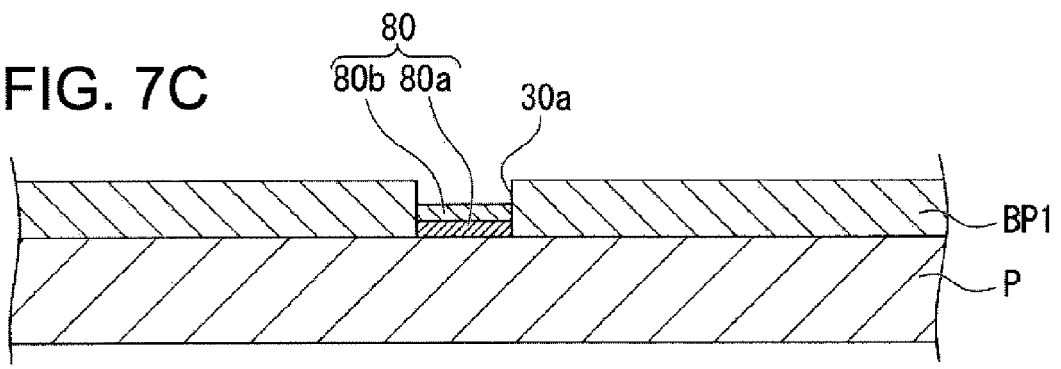

The drying process can also be carried out by lamp annealing. The light sources used for lamp annealing that are exemplified in the intermediate drying process after the first electrode layer forming process can be used. Similarly, the output of the heating is within the range of 100 W to 1000 W. By performing the intermediate drying process, the second electrode layer 80b, which is a solid, is formed on the first electrode layer 80a as shown in FIG. 7C.

Firing Process

A dried film after a discharge process is required so that a dispersion medium is thoroughly removed in order to make a good electrical contact between conductive fine particles. In addition, in a case where coating material made of an organic matter is coated on the surface of the conductive fine particle to improve its dispersibility in a liquid, the coating material is also required to be removed. Thus, heat treatment and/or light treatment is carried out to a substrate after the discharge process.

The heat treatment and/or light treatment is usually carried out in the air. However, it can also be carried out in an inert gas atmosphere such as nitrogen, argon, or helium, if necessary. The temperature for the heat treatment and/or light treatment is appropriately set depending on the boiling point (vapor pressure) of a dispersion medium, the type and pressure of atmospheric gas, thermal behavioral properties including particle dispersibility and oxidizability, the presence or nonpresence of coating material and its volume, and base-material heat resistance temperature. In the embodiment, the temperature can be set to be 250 degrees and below since the first electrode layer 80a and the second electrode layer 80b use the above-described materials. In this regard, firing can be carried out at a temperature, for example, about 280 degrees centigrade, at which the precursor BP1 of the first bank is not changed to polymethylsiloxane by a condensation reaction shown in the chemical formulas (4) to (6).

The above-described process secures electrical contact between fine particles in the dried film after a droplet discharge process, and the film is turned to be conductive. As a result, the gate electrode 80, in which the first electrode layer 80a and the second electrode layer 80b are layered, is formed as shown in FIG. 7C. The scan line 18a, which is integrated with the gate electrode 80 as shown in FIG. 3, is also formed on the glass substrate P in this process.

Here, the gate electrode 80 is formed by carrying out the drying and firing processes after disposing each type of ink (functional liquid) by a droplet discharge method. Thus, the gate electrode 80 is composed of the electrodes 80a and 80b, each of which is formed by removing a liquid in the ink. As a result, the gate electrode 80 is formed rather lower than the height of the precursor BP1 of the first bank. For example, if the height of the precursor BP1 of the first bank is 2 μm, the height of a conductive layer composed of the electrode layers 80a and 80b is approximately 0.7 μm. Accordingly, a concave part 30a is formed in the opening 30 of the precursor BP1 of the first bank since the opening 30 is not fully filled with the electrode 80.

In the above-described processes, the first electrode layer 80a made of Ag and the second electrode layer 80b made of Ni are formed, and then, the gate electrode 80 is formed as a layered structure of the first electrode layer 80a and the second electrode layer 80b. However, the first electrode layer 80a may be formed with metal such as Cu, or Al other than Ag, or an alloy substantially containing the metal. The second electrode layer 80b may also be formed with metal such as Ti, W, or Mn other than Ni, or an alloy substantially containing the metal. In addition, Mn, Ti, W or the like, which functions as an adherent layer, may be used for the first electrode layer 80a. Ag, Cu, Al, or the like, which functions as a major conductive layer, may be used for the second electrode layer 80b. The gate electrode 80 may be formed by layering more than two electrode layers. Naturally, the gate electrode 80 may be formed with a single electrode layer.

Forming Process of a Cap Layer Precursor and the Second Bank Precursor

Figure 7D:
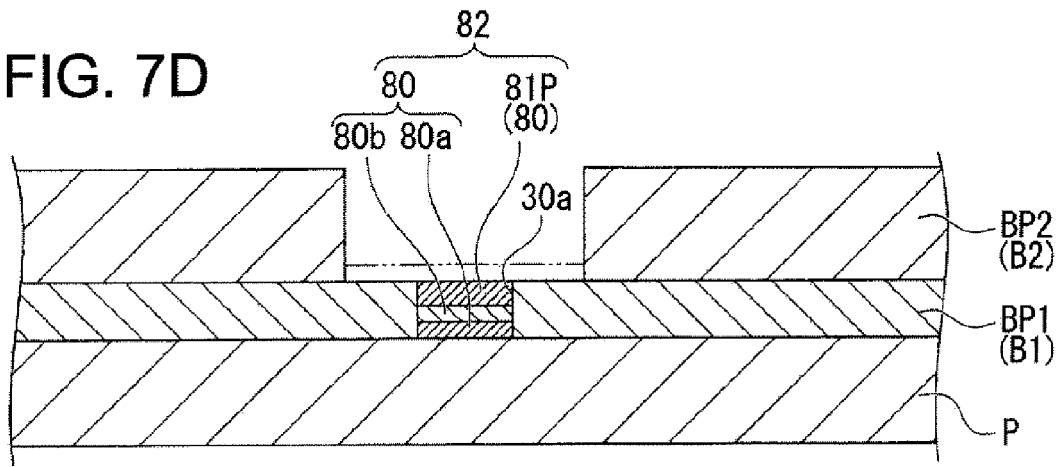

Next, a polysilazane liquid is discharged from the droplet discharge head 301 as ink and disposed into the concave part 30a so as to cover the gate electrode 80. The ink (polysilazane liquid) is also discharged from the droplet discharge head 301 and disposed to a predetermined position on the precursor BP1 of the first bank. As a result, a precursor 81P of the cap layer and a precursor BP2 of the second bank are formed as shown in FIG. 7D. As for the ink made of the polysilazane liquid, the photosensitive polysilazane liquid, which is used as the material for forming the precursor BP1 of the first bank, is used. The predetermined position on the precursor BP1 of the first bank is the position to partition a region for forming the source electrode 34 and the drain electrode 35, and a region for forming the second bank B2.

Here, the discharge of the polysilazane liquid in the concave part 30a, and the discharge of the polysilazane liquid to the predetermined position are respectively carried out in a series process since each discharge is differentiated by the droplet discharge method using the droplet discharge head 301. In addition, not only the position to be discharged but also each discharged quantity can be differentiated. Namely, the quantity of the polysilazane liquid provided in the concave 30a, and the quantity of the polysilazane liquid provided on the precursor BP1 of the first bank are differentiated from each other. As a result, the resulting thicknesses of the precursor SIP of the cap layer and the precursor BP2 of the second bank can be respective desired film thicknesses.

After providing the polysilazane liquid in the concave part 30a and on the precursor BP1 of the first bank, the resulting polysilazane thin film is pre-baked, for example, at 110 degrees centigrade and for about one minute on a hot plate, if necessary.

Next, a surface, on which the precursor BP2 of the second bank has been formed, of the substrate P is wholly exposed. The exposure conditions are the same as those in the process shown in FIG. 6B. Since the whole exposure is carried out, the precursor BP2 of the second bank, and the precursor BP1, which is not exposed in the foregoing exposure process, are exposed. As a result, the polysilazane forming the precursors BP2 and BP1 is partially hydrolyzed, and finally, the silanol (Si—OH) bond is produced to decompose polysilazane.

Then, a humidification process is carried out again. The humidification conditions are the same as those in the process shown in FIG. 6C. By performing the humidification process, Si—OH bond are further enhanced in polysilazane forming the precursors BP2 and BP1 of the respective banks, and the precursor 81P of the cap layer.

Forming Processes of the First Bank, the Second Bank, and the Cap Layer.

Next, a firing process is carried out, for example, at 300 degrees centigrade, and for about 60 minutes. As the result of the firing process, the first precursor BP1 of the first bank, the precursor BP2 of the second bank, and the precursor 81P of the cap layer, which are made of polisilzane, which has been formed to SiOH by the humidification process are easily formed to (SiOSi) as shown in the chemical formulas (4) to (6) by firing. Namely, they are converted to a silica base ceramic film including few (or no) SiNH bond or polymethylsiloxane having polysiloxane as a skeleton. Accordingly, each of the first bank B1, the second bank B2, and the cap layer 80 is formed as shown in FIG. 7D.

While the cap layer 81 and the second hank B2 are separated in FIG. 7D, the cap layer 81 and the second bank B2 are not always necessarily separated. For example, as shown with a chain double-dashed line in FIG. 7D, the cap layer 81 and the second bank B2 may be continuously formed by partially covering part, which is the vicinity of the opening 30 (concave part 30a), of the precursor BP1 (first bank BP1) of the first bank. It is preferable that the cap layer 81 is formed so that its top surface is nearly the same height of the upper surface of the first bank B1 in order that the concave part 30a disappears when the concave part 30a is fully filled with the cap layer 81. However, if the polysilazane liquid is merely provided in the concave part 30a, as the result, the concave part 30a is not fully filled since the film thickness is reduced by the drying and firing processes. Thus, the concave part 30a is not simply filled with the polysilazane liquid, but is excessively filled so that the polysilazane liquid overflowed from the concave 30a is provided around it. As a result, the concave part 30a can be fully filled even though a part of the cap layer 81 remains on the first bank B1 as a thin film shown as the chain double-dashed line after thy drying and firing processes.

The cap layer 81 has sufficient density due to its skeleton structure in which polysiloxane, which is an inorganic matter, forms a skeleton. Therefore, its surface flatness is markedly improved than that of the surface of the gate electrode 80. The second bank B2 and the first bank B1, which are formed concurrently with the cap layer 81, as well as the cap layer 81 are markedly favorable in heat resistance as compared with banks made of organic material since they has a skeleton of polysiloxane, which is an inorganic matter.

Gate Insulation Film Forming Process

Figure 8A:
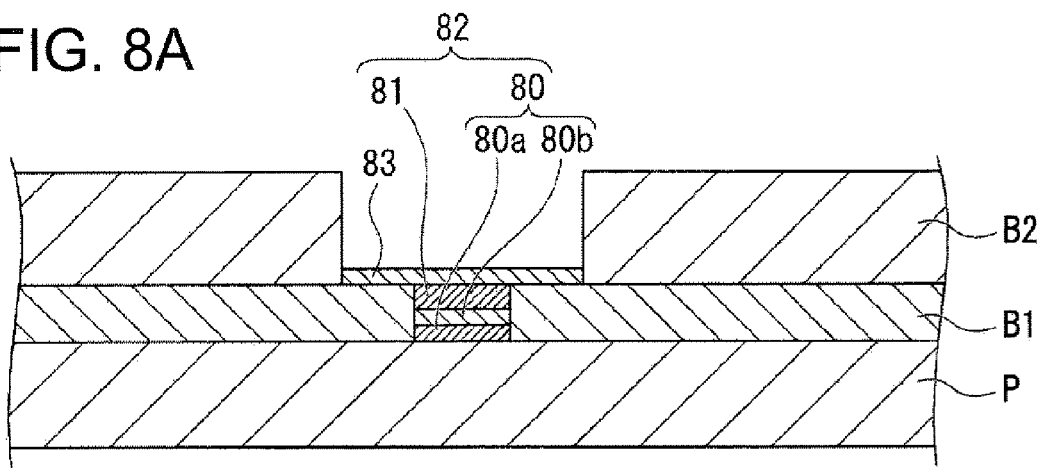
FIG. 8 is a cross-sectional process drawing illustrating the method for manufacturing a thin film transistor of the embodiment.

Next, the gate insulation film 83 made of silicon nitride is formed in a region partitioned by the second bank B2 as shown in FIG. 8A. The gate insulation film 83 can be formed by adequately patterning film, using a photolithography method. The film is wholly deposited by, for example, plasma CVD. Since the concave part 30a is favorably filled with the cap layer 81 so that a step at a part located directly above the gate electrode 80 disappears as described above, film forming property or patterning property with regard to the gate insulation film 83 and the semiconductor layer 33 described later are favorable. As raw material gas used in CVD process, the following mixed gas is preferably used: monosilane and dinitrogen monoxide; tetraethoxysilane (TEOS) $Si(OC_2H_5)_4$ and oxygen; and disilane and ammonia. The film thickness of gate insulation film 83 is about 150 nm to 400 nm. Patterning on deposited silicon nitride is not always necessarily carried out. It may be acceptable that the silicon nitride film is left on the second bank B2 as it is formed.

Semiconductor Layer Forming Process

Figure 8B:
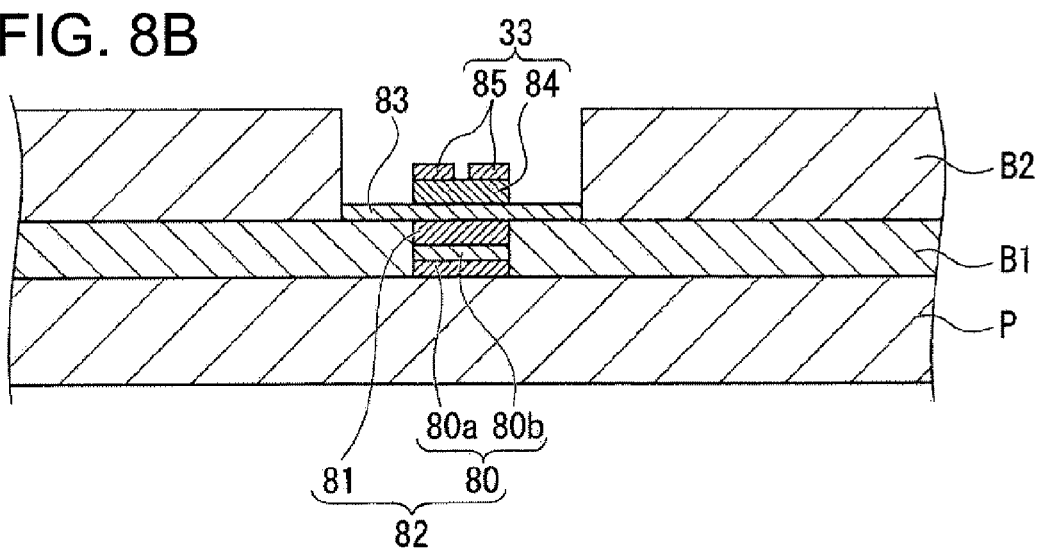
Figure 8C:
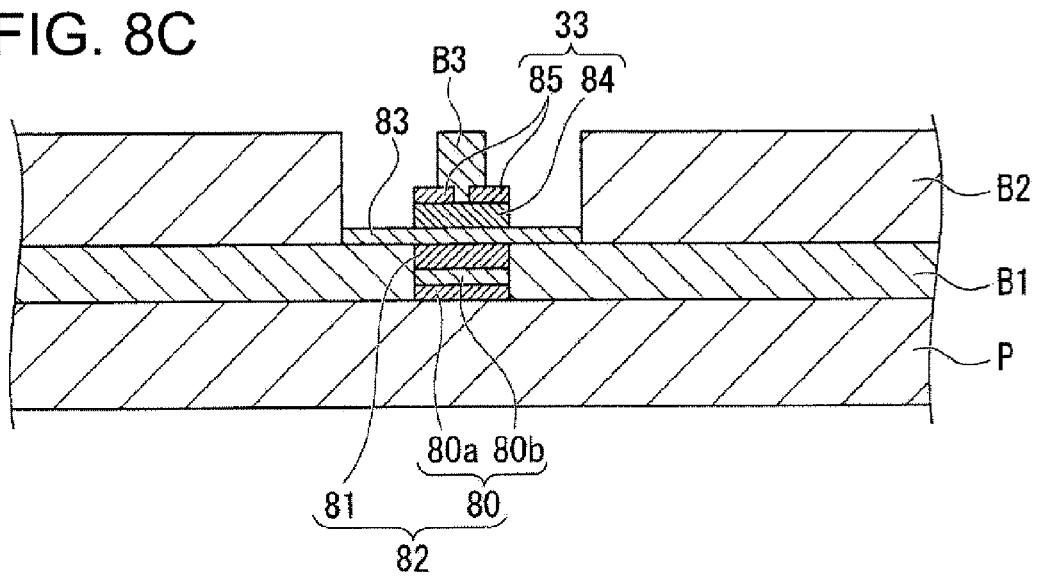

Next, the semiconductor layer 33 shown in FIG. 8B is formed on the gate insulation film 83. The semiconductor layer 33 is achieved as follows: amorphous silicon film having a thickness of about 150 nm to 250 nm, and $N^+$ silicon film having a thickness of about 50 nm to 100 nm are deposited on the entire surface of the substrate P, on which the gate insulation film 83 has been formed, as a layered structure by plasma CVD or the like; and a predetermined shape is patterned by photolithography. As raw material gas used in the amorphous silicon film forming process, disilane or monosilane is preferably used. In a succeeding $N^+$ silicon film forming process, film can be formed with a film forming device used for forming the amorphous silicon film by introducing raw material gas for forming the $N^+$ silicon layer.

Then, the amorphous silicon film and the $N^+$ silicon film are patterned by photolithography as a pattern shown in FIG. 8B. As a result, the semiconductor layer 33 is achieved in which the amorphous silicon layer 84 and the $N^+$ silicon layer 85 are layered on the gate insulation film 83 as a given planar shape. In patterning, a resist is selectively provided on the surface of the $N^+$ silicon film so that the resist is used as a mask for etching. The resist has a rough concave shape similar to the side sectional shape of the semiconductor layer 33 shown in FIG. 8B. By this patterning, the $N^+$ silicon layer 85 in a region that coincides with the gate electrode 80 in a plane view is selectively removed so as to divide it into two regions. The divided regions, which are the $N^+$ silicon layers 85, respectively form a source contact region and a drain contact region.

Next, as shown in FIG. 5C, the third bank B3 made of insulation material is formed on the $N^+$ silicon layers 85, which are two regions divided, so that the $N^+$ silicon layers 85 are electrically isolated. The third bank B3 is also formed in the same manner as that of the second bank B2. Namely, a polysilazane liquid (ink) is selectively discharged from the droplet discharge head 301 and provided, and then a drying process and a firing process are carried out. The third bank B3 formed as described above partitions a region for forming the source electrode 34 and a region for forming drain electrode 35 together with the second bank B2.

Electrode Forming Process

Then, the source electrode 34 and the drain electrode 35 both of which are shown in FIG. 4 are formed on the glass substrate P on which the semiconductor layer 33 has been formed.

Lyophobic Process

First, a lyophobic process is carried out to the second bank B2 and the third bank B3 to give lyophobicity on their surfaces. As for the lyophobic process, a plasma treatment method ($CF_4$ plasma treatment method) can be employed as an example, which is carried out in the atmospheric air with tetrafluoromethane as a treatment gas.

Electrode Film Forming Process

Next, ink (functional liquid) for forming the source electrode 34 and the drain electrode 35 that are shown in FIG. 4 is applied to a region surrounded by the second bank B2 and the third bank B3 by using the droplet discharge device IJ. Here, ink is discharged, which contains silver as a conductive fine particle and diethylene glycol diethyl ether as a solvent (dispersion medium). After discharging a droplet, a drying process is carried out in order to remove a dispersion medium, if necessary. The drying process can be carried out, for example, by using a typical hot plate or electric furnace for heating the substrate P. In the embodiment, for example, the process is carried out at 180 degrees centigrade for about 60 minutes. The heating may be carried out in a nitrogen gas ($N_2$) atmosphere, need not always necessarily to be done in the air.

The drying process can also be carried out by lamp annealing. The light sources used for lamp annealing that are exemplified in the intermediate drying process after the first electrode layer forming process can be used. Similarly, the output of the heating is within the range of 100 W to 1000 W.

Firing Process

A dried film after a discharge process is required so that a dispersion medium is thoroughly removed in order to make a good electrical contact between fine particles. In addition, in a case where coating material made of an organic matter is coated on the surface of the conductive fine particle to improve its dispersibility, the coating material is required to be removed. Thus, heat treatment and/or light treatment is carried out to the substrate P after the discharge process. The heat treatment and/or light treatment can be carried out in the same manner as the firing conditions in forming the gate electrode 80.

Figure 9A:
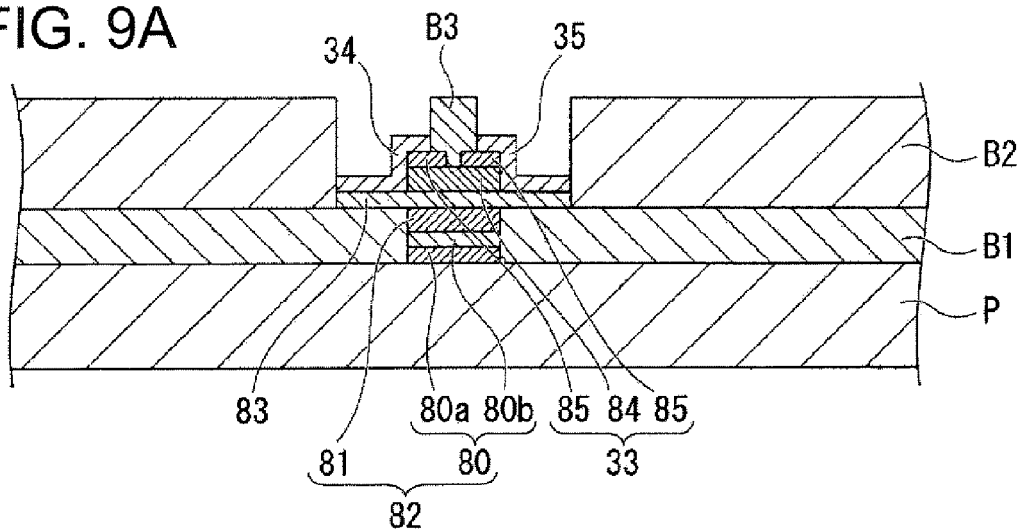
FIG. 9 is a cross-sectional process drawing illustrating the method for manufacturing a thin film transistor of the embodiment.

Accordingly, electrical contact between fine particles in the dried film after the discharge process is secured, so that the film is turned to be conductive. As a result, as shown in FIG. 9A, the source electrode 34, which is connected to the $N^+$ silicon layer 85 at one side to be electrically conducted, and the drain electrode 35, which is connected to the $N^+$ silicon layer 85 at the other side to be electrically conducted, are formed.

Figure 9B:
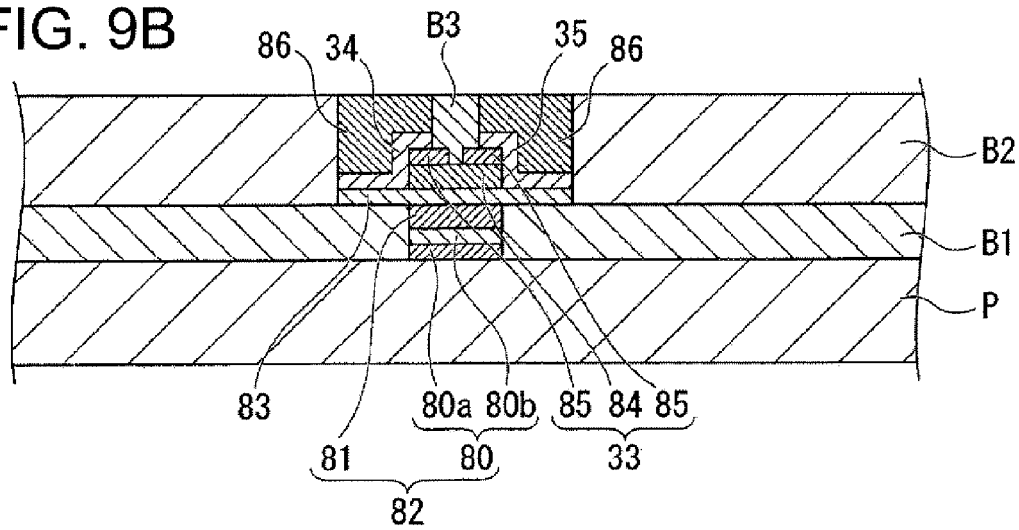

Next, the insulation material 86 is provided in a concave part (opening) so that the concave (opening) is filled up as shown in FIG. 9B. The concave part is partitioned by the second bank B2 and the third bank B3, and in which the source electrode 34 and the drain electrode 35 are formed.

Figure 9C:
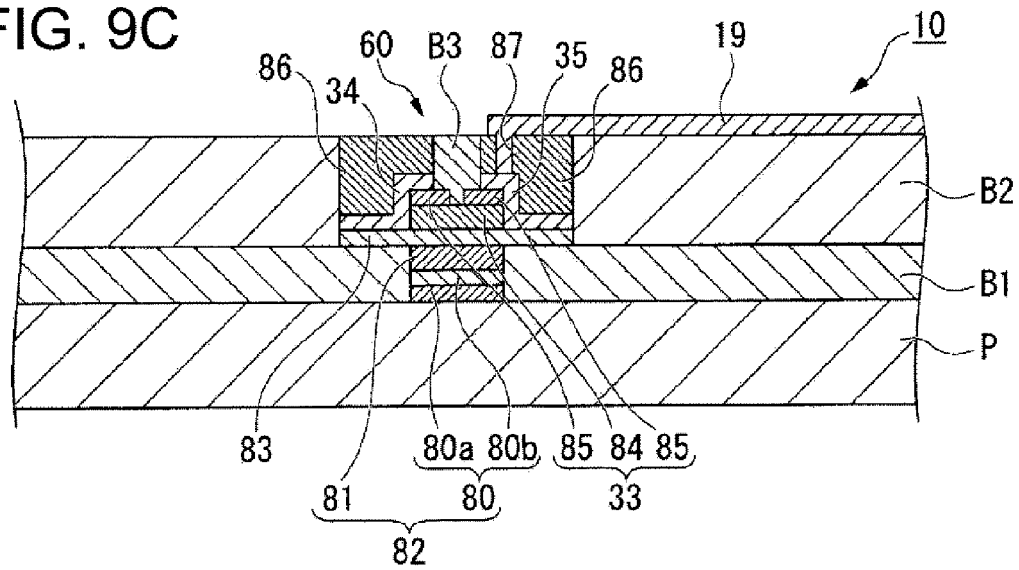

Then, a contact hole 87 is formed in the insulation material 86 at the drain electrode 35 side as shown in FIG. 9C. Then, a transparent electrode layer is formed by a gas phase method such as sputtering or vapor deposition, or a liquid phase method such as a droplet discharge method, and patterning is carried out, if necessary. As a result, the pixel electrode 19 is formed.

Accordingly, the TFT array substrate 10 is achieved by forming the TFT 60 according to the invention at the inner side (upper side shown in the figure) of the glass substrate P, and further by forming the pixel electrode 19.

According to the manufacturing method of the embodiment, the first precursor BP1 of the first bank is formed with a polysilazane liquid, subsequently, the precursor BP2 of the second bank is formed with the polysilazane liquid on the first precursor BP1 of the first bank, and the precursor 81P of the cap layer is formed on the gate electrode 80 with the polysilazane liquid. Then, the precursor BP1 of the first bank, the precursor BP2 of the second bank, and the precursor 81P of the cap layer are fired together so that the first bank B1, the second bank B2, and the cap layer 80 are together formed by one time firing. Therefore, productivity can be improved by simplifying production processes as compared with the case in which they are individually fired.

In addition, the cap layer 81 covering the gate electrode 80 is formed as an inorganic layer including polysiloxane as a skeleton. The gate electrode 80 has sufficient density since the inorganic layer has a skeleton structure. As a result, metal elements in the gate electrode 80 can effectively be prevented from being diffused. Consequently, the TFT 60 can be stabilized by preventing its characteristics from being lowered.

In addition, since the cap layer 81 made of the inorganic layer has sufficient density, it has sufficient flatness as compared with the gate electrode 80 formed by the droplet discharge method. Accordingly, the boundary face between the cap layer 81 and the gate insulation film 83 formed on the cap layer 81 is made sufficiently flat. As a result, stability of transistor characteristics can be improved.

Further, productivity can be improved by simplifying processes since the precursor 81P of the cap layer and the precursor BP2 of the second bank are formed by the droplet discharge method in the same process.

In the liquid crystal display device 100 equipped with the TFT array substrate 10, productivity of the liquid crystal display device 100 is also improved since the productivity of the TFT 60 is improved.

In the embodiment, ink (functional liquid) is provided in the opening 30 of the precursor BP1 of the first bank, and then the firing process is carried out to form the gate electrode 80. Subsequently, the precursor BP1 of the first bank and the precursor BP2 of the second bank are fired. However, the gate electrode 80 may be left as a precursor, which is subjected to up to the intermediate drying process, until before the precursor BP1 of the first bank and the precursor BP2 of the second bank are fired. Then, the precursor of the gate electrode 80 may also be subjected to the firing process together with the precursor BP1 of the first bank, the precursor BP2 of the second bank, and the precursor 81P of the cap layer so that the gate electrode 80 is formed together with the fist bank B1, the second bank B2, and the cap layer 80 at one time. As a result, the manufacturing processes are more simplified, and productivity is improved.

In addition, while in the embodiment, the gate electrode 80 is covered with the cap layer 81 made of a polysilazane liquid, but the invention is not limited to this. The gate electrode 80 and the gate insulation film 83 may be directly contacted without providing the cap layer 80. Alternatively, the second electrode layer 80, which is the upper layer of the first electrode layer 80a, may be formed with, for example, Ni so as to function as the cap layer.

The method for manufacturing a thin film transistor of the invention can also be applied to manufacturing methods for various electro-optical devices equipped with a thin film transistor. For example, the method can preferably applied to form a thin film transistor included in liquid crystal devices, organic electrroluminescent display devices, plasma display devices, or the like.

Electronic Apparatus

Figure 10:
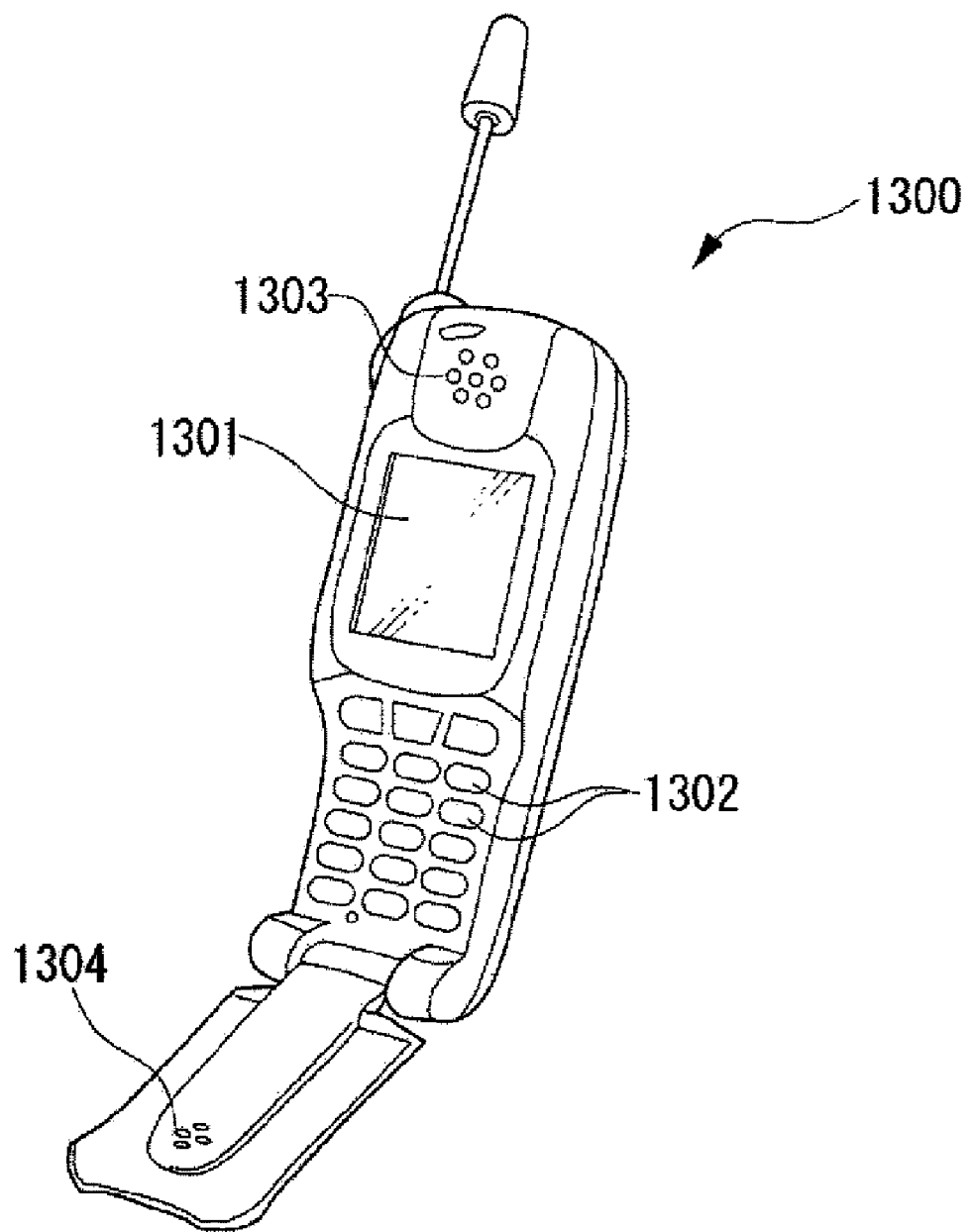
FIG. 10 is a perspective structural view illustrating an example of electronic apparatuses.

FIG. 10 is a perspective view illustrating an example of electro apparatuses according to the invention. A cellular phone 1300 shown in the figure includes a display 1301, which is a small size liquid crystal display device of the invention, a plurality of operation buttons 1302, a receiver 1303, and a transmitter 1304.

The electro-optical device of the embodiment can preferably be used not only for the cellular phone, but also for image display means of the following electronic apparatuses: electronic books; personal computers; digital still cameras; image monitor displays; video tape recorders of viewfinder types or monitor viewing types; car navigation devices; pagers; electronic notebooks; electric calculators; word processors; work stations; picture phones; POS terminals; apparatuses equipped with a touch panel, and so on.

These electronic apparatuses are favorable, since electro-optical device is favorable in terms of stable characteristics and improved productivity.

What is claimed is:

1. A method for manufacturing a thin film transistor in which a gate electrode, a semiconductor layer, and a source electrode and a drain electrode both of which are coupled to the semiconductor layer, are fabricated on a substrate, the method comprising:

forming a precursor of a first bank corresponding to a region to form the gate electrode on the substrate with one of a polysilazane liquid, a polysilane liquid, and a polysiloxane liquid;

forming a precursor of a second bank corresponding to a region to form the source electrode and the drain electrode on a predetermined position of the precursor of the first bank with one of a polysilazane liquid, a polysilane liquid, and a polysiloxane liquid by using a droplet discharge method;

firing the precursor of the first bank and the precursor of the second bank together so as to together form the first bank and the second bank both of which are made of an inorganic layer having polysiloxane as a skeleton;

providing a functional liquid containing a conductive material to a region partitioned by one of the precursor of the first bank and the first bank formed from the precursor by using a droplet discharge method so as to form the gate electrode;

forming a semiconductor layer on a part located immediately above the gate electrode in a region partitioned by the second bank with an insulation film between the semiconductor layer and the part; and providing a functional liquid containing a conductive material to a region partitioned by the second bank by using a droplet discharge method so as to form the source electrode and the drain electrode both of which are coupled to the semiconductor layer.

2. A method for manufacturing a thin film transistor in which a gate electrode, a semiconductor layer, and a source electrode and a drain electrode both of which are coupled to the semiconductor layer, are fabricated on a substrate, the method comprising:

forming a precursor of a first bank corresponding to a region to form the gate electrode on the substrate with one of a polysilazane liquid, a polysilane liquid, and a polysiloxane liquid;

providing a functional liquid containing a conductive material to a region partitioned by the precursor of the first bank by using a droplet discharge method so as to form one of the gate electrode and a precursor of the gate electrode;

providing one of a polysilazane liquid, a polysilane liquid, and a polysiloxane liquid by a droplet discharge method on the provided functional liquid so as to form a precursor of a cap layer;

providing one of a polysilazane liquid, a polysilane liquid, and a polysiloxane liquid by a droplet discharge method to a predetermined position on the precursor of the first bank so as to form a precursor of a second bank corresponding to a region to form the source electrode and the drain electrode;

firing the precursor of the first bank, the precursor of the second bank and the precursor of the cap layer together so as to together form the first bank, the second bank and the cap layer those of which are made of an inorganic layer having polysiloxane as a skeleton;

forming a semiconductor layer on the cap layer in a region partitioned by the second bank with an insulation film between the semiconductor layer and the cap layer; and providing a functional liquid containing a conductive material to a region partitioned by the second bank by using a droplet discharge method so as to form the source electrode and the drain electrode both of which are coupled to the semiconductor layer.

3. The method for manufacturing a thin film transistor according to claim 1, wherein a photosensitive material that contains one of a photo acid generating agent and a photo base generating agent, and functions as a positive type resist is used as the polysilazane liquid, the polysilane liquid, and the polysiloxane liquid.

* * * * *